(12) United States Patent
Oh et al.

(10) Patent No.: US 9,871,122 B2
(45) Date of Patent: Jan. 16, 2018

(54) METHODS OF FABRICATING A SEMICONDUCTOR DEVICE

(71) Applicant: SAMSUNG ELECTRONICS CO., LTD., Suwon-si, Gyeonggi-Do (KR)

(72) Inventors: In-Wook Oh, Suwon-si (KR); Hyunjae Lee, Seoul (KR); Jaeseok Yang, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/244,265

(22) Filed: Aug. 23, 2016

(65) Prior Publication Data

US 2017/0154976 A1 Jun. 1, 2017

(30) Foreign Application Priority Data

Nov. 27, 2015 (KR) ........................ 10-2015-0167578

(51) Int. Cl.
| | | |
|---|---|---|
| H01L 21/336 | (2006.01) |
| H01L 29/66 | (2006.01) |
| H01L 27/11573 | (2017.01) |
| H01L 27/11575 | (2017.01) |
| H01L 27/32 | (2006.01) |
| H01L 23/528 | (2006.01) |
| H01L 21/768 | (2006.01) |

(52) U.S. Cl.
CPC .... *H01L 29/6681* (2013.01); *H01L 21/76816* (2013.01); *H01L 23/528* (2013.01); *H01L 27/11573* (2013.01); *H01L 27/11575* (2013.01); *H01L 27/3223* (2013.01)

(58) Field of Classification Search
CPC ............ H01L 23/528; H01L 27/11573; H01L 27/11575; H01L 27/3223; H01L 21/76816; H01L 29/6681
See application file for complete search history.

(56) References Cited

U.S. PATENT DOCUMENTS

| | | |
|---|---|---|
| 7,974,137 B2 | 7/2011 | Sakoh |
| 8,816,444 B2 | 8/2014 | Wann et al. |
| 8,869,090 B2 | 10/2014 | Ke et al. |

(Continued)

FOREIGN PATENT DOCUMENTS

| | | |
|---|---|---|
| JP | 08-340048 | 12/1996 |
| JP | 11-016999 | 1/1999 |

*Primary Examiner* — Zandra Smith
*Assistant Examiner* — John M Parker
(74) *Attorney, Agent, or Firm* — F. Chau & Associates, LLC

(57) ABSTRACT

A method of fabricating a semiconductor device includes providing a substrate that includes first and second main regions and a dummy region, and forming dummy active patterns on the dummy region. The first and second main regions are spaced apart from each other in a first direction and the dummy region includes a dummy connection region between the first and second main regions and first and second dummy cell regions spaced apart from each other in a second direction. First dummy active patterns, second dummy active patterns, and connection dummy active patterns connecting some of the first dummy active patterns to some of the second dummy active patterns are provided on the first and second dummy cell regions and the dummy connection region, respectively.

20 Claims, 22 Drawing Sheets

(56) References Cited

U.S. PATENT DOCUMENTS

| | | |
|---|---|---|
| 8,946,781 B2 | 2/2015 | Becker et al. |
| 9,105,467 B2 | 6/2015 | Lee et al. |
| 9,318,477 B2 | 4/2016 | Lee et al. |
| 2009/0050975 A1 | 2/2009 | Bryant et al. |
| 2013/0277760 A1 | 10/2013 | Lu et al. |
| 2014/0097493 A1* | 4/2014 | Baek .................. H01L 27/1211 257/347 |
| 2014/0183756 A1* | 7/2014 | Hwang ............... H01L 29/7889 257/774 |
| 2014/0246780 A1* | 9/2014 | Takada ............... H01L 21/3212 257/773 |
| 2015/0091188 A1* | 4/2015 | Lee .................... H01L 27/0207 257/774 |
| 2015/0137210 A1* | 5/2015 | Nam ................. H01L 27/11582 257/324 |
| 2015/0137252 A1 | 5/2015 | Baek et al. |
| 2017/0200772 A1* | 7/2017 | Yoshida ............. H01L 27/3218 |

\* cited by examiner

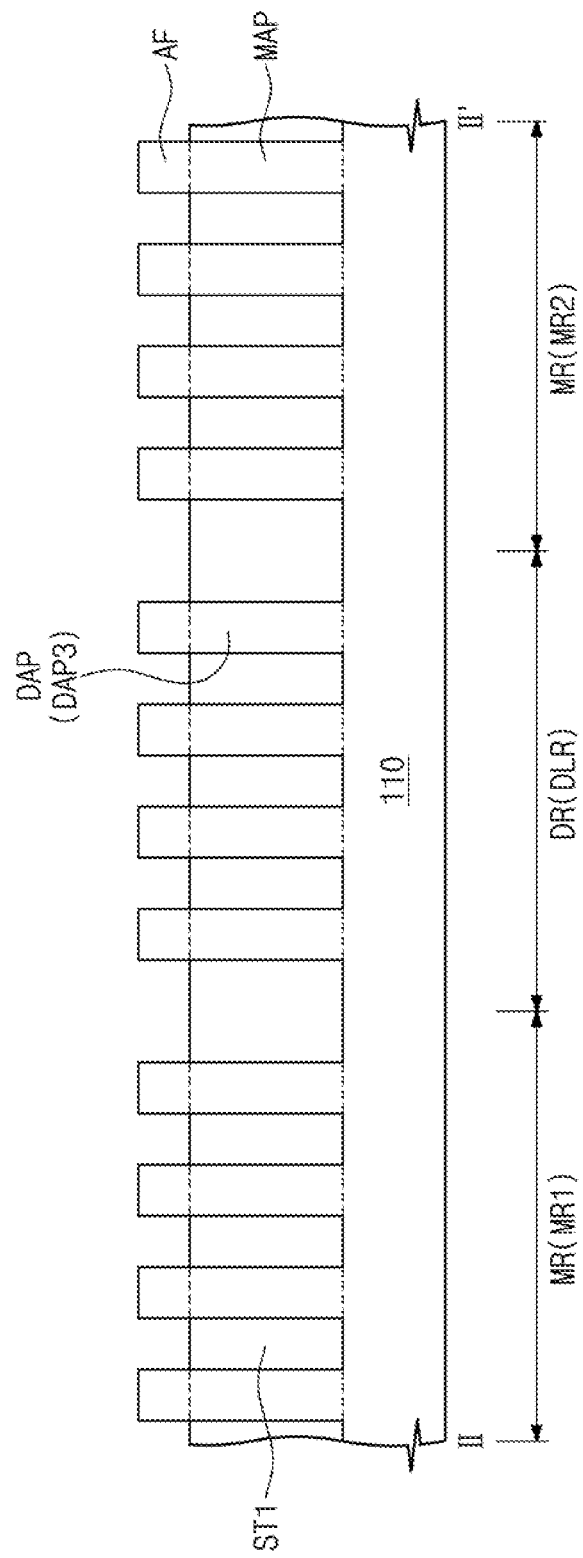

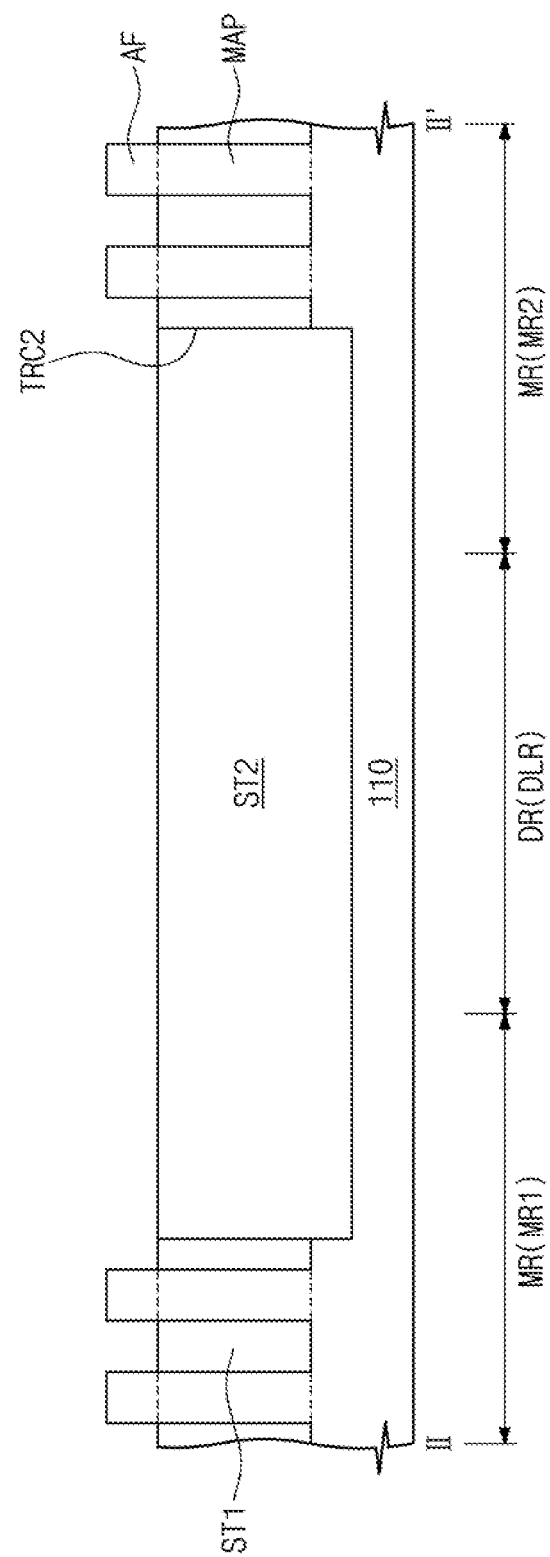

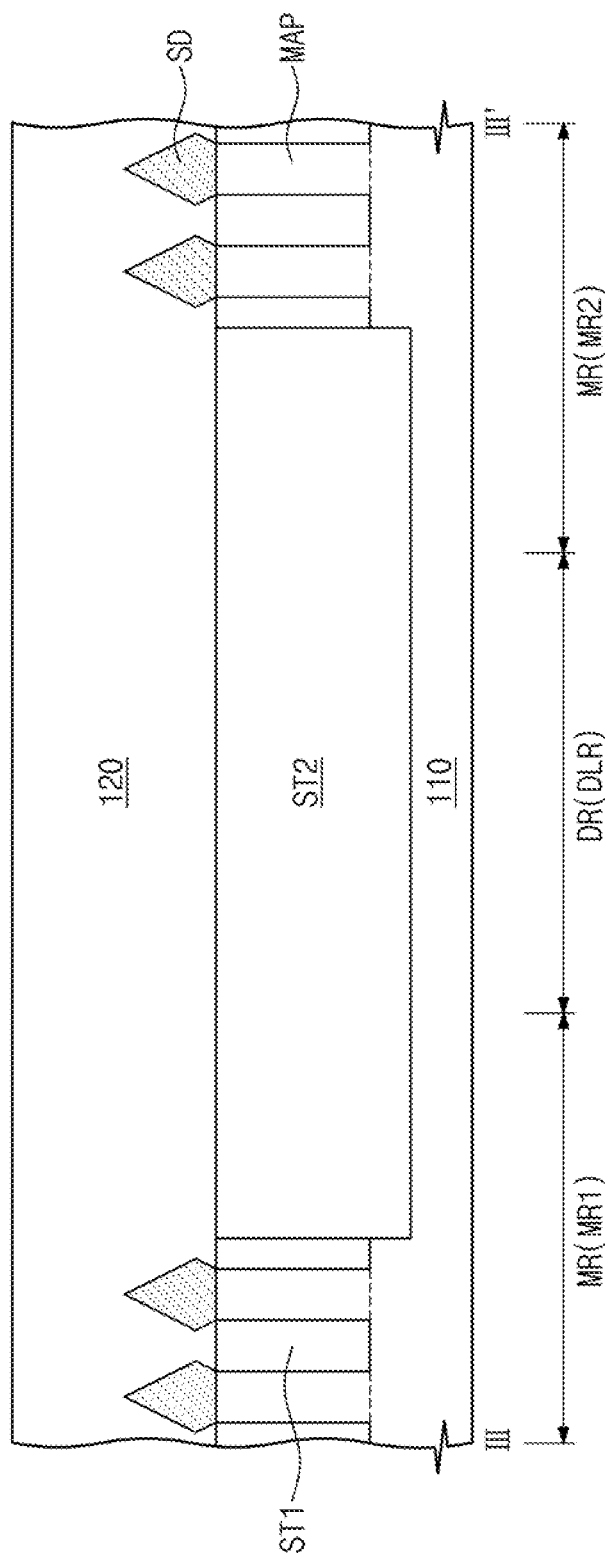

METHODS OF FABRICATING A SEMICONDUCTOR DEVICE

CROSS-REFERENCE TO RELATED APPLICATIONS

This U.S. non-provisional patent application claims priority under 35 U.S.C. §119 from, and the benefit of, Korean Patent Application No. 10-2015-0167578, filed on Nov. 27, 2015 in the Korean Intellectual Property Office, the contents of which are herein incorporated by reference in their entirety.

BACKGROUND

Embodiments of the present disclosure are directed to a method of fabricating a semiconductor device, and in particular, to a method of fabricating a semiconductor device that includes fin-field-effect transistors (FinFETs).

A semiconductor device typically includes integrated circuits (ICs) that use metal-oxide-semiconductor field-effect transistors (MOS-FETs). As size reduction and design rule of the semiconductor device increases, MOS-FETs are being increasingly scaled down. The size reduction of a MOS-FET may cause deterioration in operational properties of the semiconductor device, such as a short channel effect.

SUMMARY

Some embodiments of the inventive concept can provide a high-yield method of fabricating a semiconductor device.

According to some embodiments of the inventive concept, a method of fabricating a semiconductor device includes providing a substrate that includes first and second main regions and a dummy region, forming dummy active patterns on the dummy region, and forming dummy gate electrodes, The substrate includes first and second main regions spaced apart from each other in a first direction, and a dummy region that includes a dummy connection region between the first and second main regions, and first and second dummy cell regions spaced apart from each other in a second direction orthogonal to the first direction with the dummy connection region interposed therebetween. The dummy active patterns extend in the second direction and are spaced apart from each other in the first direction. The dummy active patterns include first dummy active patterns on the first dummy cell region, second dummy active patterns on the second dummy cell region, and connection dummy active patterns on the dummy connection region that connect some of the first dummy active patterns to some of the second dummy active patterns. The dummy gate electrodes are formed on the first and second dummy cell regions and extend in the first direction. The number of the connection dummy active patterns is less than the number of the first dummy active patterns and the number of the second dummy active patterns.

According to some embodiments of the inventive concept, a method of fabricating a semiconductor device includes providing a substrate that includes first and second main regions spaced apart from each other in a first direction, and a dummy region that comprises a dummy connection region between the first and second main regions and first and second dummy cell regions spaced apart from each other in a second direction orthogonal to the first direction with the dummy connection region interposed therebetween, forming dummy active patterns that extend in the second direction and are spaced apart from each other in the first direction on the dummy region, wherein the dummy active patterns comprise first dummy active patterns on the first dummy cell region, second dummy active patterns on the second dummy cell region, and connection dummy active patterns on the dummy connection region, wherein the connection dummy active patterns connect some of the first dummy active patterns to some of the second dummy active patterns, and forming a trench in each of the first and second dummy cell regions, the trench defining dummy active regions which are arranged in the first direction and are spaced apart from each other in the first direction. Forming the trench comprises removing the dummy active patterns from a region between an adjacent pair of the dummy active regions. The number of connection dummy active patterns is less than a sum of the number of the dummy active patterns in each of the dummy active regions and the number of dummy active patterns removed from the region between the adjacent pair of dummy active regions.

BRIEF DESCRIPTION OF THE DRAWINGS

FIGS. 2A, 3, and 4A to 7A are plan views that illustrate a method of fabricating a semiconductor device, according to some embodiments of the inventive concept.

FIGS. 2B and 4B to 7B are sectional views taken along lines I-I' of FIGS. 2A and 4A to 7A, respectively.

FIGS. 2C and 4C to 7C are sectional views taken along lines II-II' of FIGS. 2A and 4A to 7A, respectively.

FIGS. 2D and 4D to 7D are sectional views taken along lines III-III' of FIGS. 2A and 4A to 7A, respectively.

DETAILED DESCRIPTION

Figure 1:
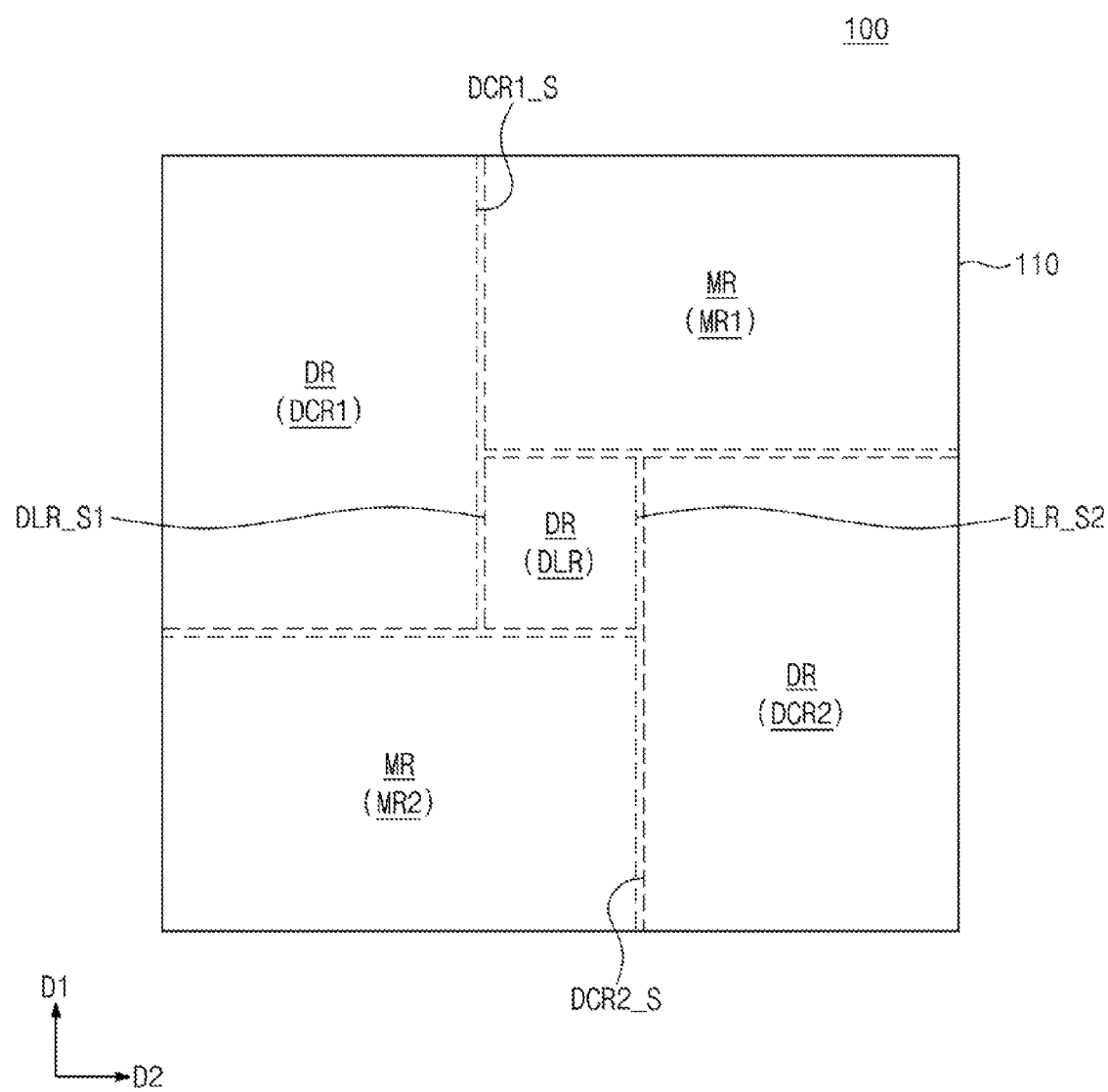
FIG. 1 is a plan view that schematically illustrates a semiconductor device according to some embodiments of the inventive concept.
Figure 2A:
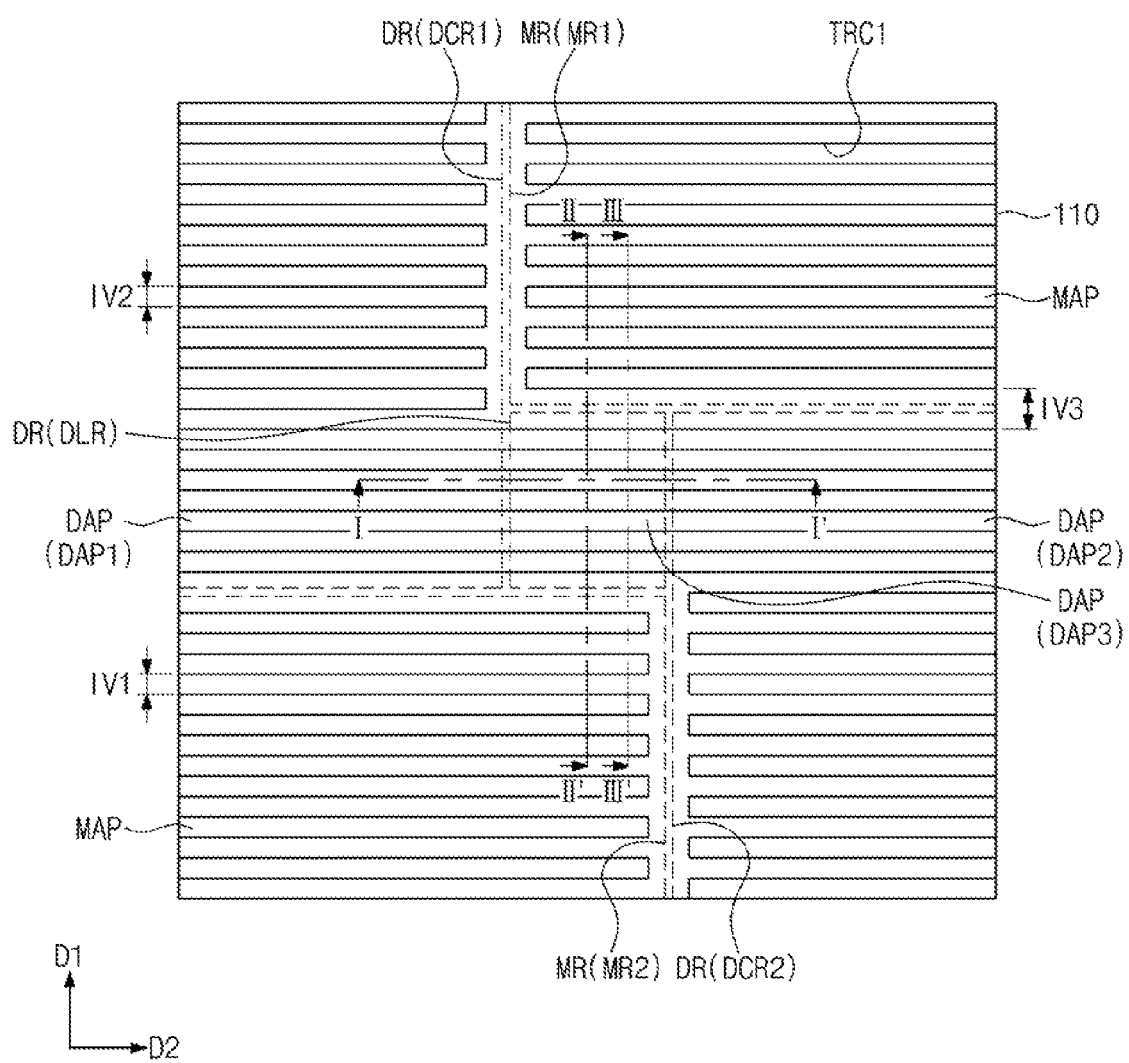
Figure 2B:
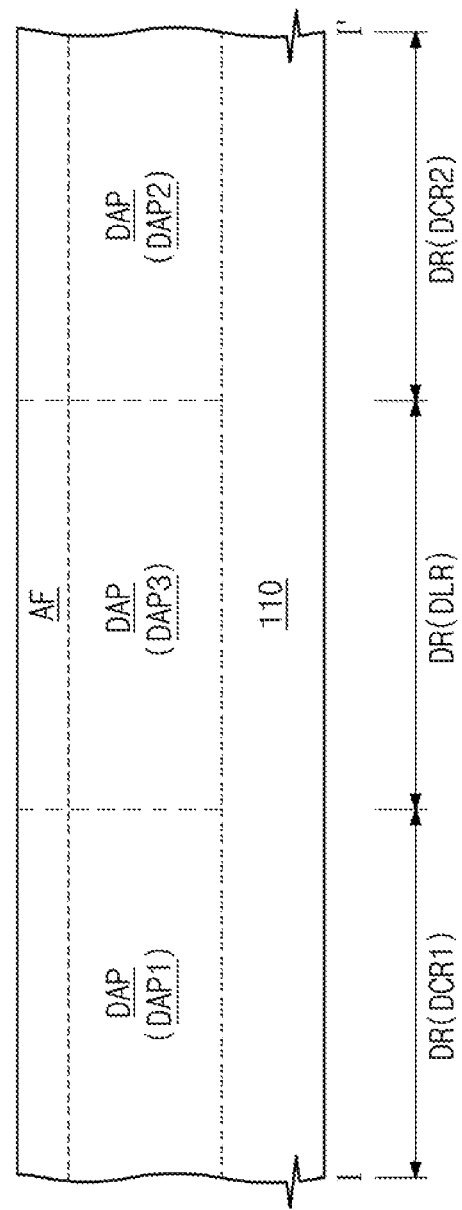
Figure 2D:
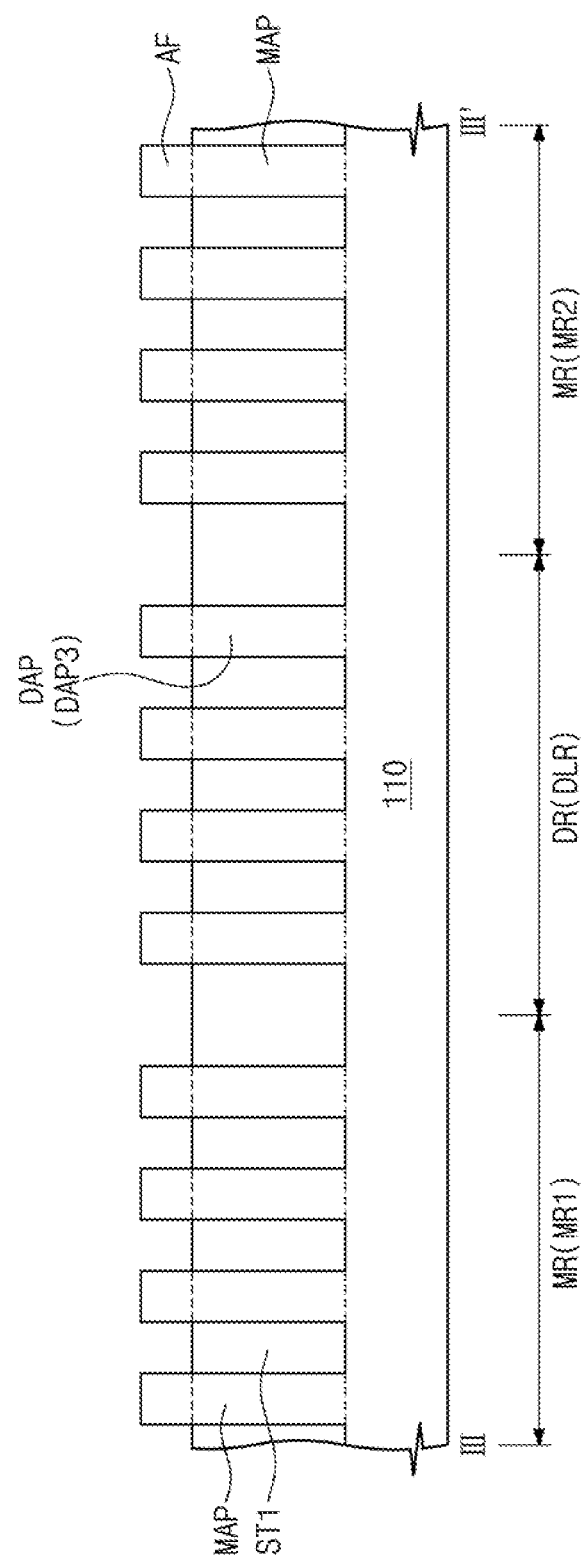

Embodiments of the inventive concepts will now be described more fully hereinafter with reference to the accompanying drawings, in which exemplary embodiments of the inventive concepts are shown. The same reference numerals or the same reference designators may denote the same elements throughout the specification.

FIG. 1 is a plan view that schematically illustrates a semiconductor device according to some embodiments of the inventive concept.

Referring to FIG. 1, a semiconductor device 100 includes a main region MR and a dummy region DR disposed near the main region MR on a substrate 110. The main region MR is a region on which various FinFET-based semiconductor elements are integrated. The dummy region DR helps to achieve uniform process conditions throughout the entire region of the substrate 110 when performing steps for forming the semiconductor elements. For example, a plurality of FinFET-type dummy unit cells may be integrated on the dummy region DR simultaneously with integration of the semiconductor elements, the dummy unit cells may help maintain uniform process conditions throughout the entire region of the substrate 110 during the integration process. That is, the presence of the dummy unit cells disposed on the dummy region DR helps to improve uniformity and reliability of the semiconductor elements to be provided on the main region MR. The dummy unit cells are electrically disconnected from the semiconductor elements of the main region MR. In other words, the dummy unit cells are electrically floated. For example, gate electrodes and source/ drain regions of the dummy unit cells are not electrically connected to any other device, and are thus electrically floated.

According to some embodiments of the inventive concept, the main region MR includes first and second main regions MR1 and MR2 spaced apart from each other in a first direction D1. The dummy region DR includes first and second dummy cell regions DCR1 and DCR2 spaced apart from each other in a second direction D2 that is orthogonal to the first direction D1, and a dummy connection region DLR that connects the first and second dummy cell regions DCR1 and DCR2 to each other. The dummy connection region DLR is positioned between the first and second dummy cell regions DCR1 and DCR2 and between the first and second main regions MR1 and MR2. A width of the dummy connection region DLR is less than that of the first and second dummy cell regions DCR1 and DCR2, when measured in the first direction D1.

According to some embodiments, the dummy connection region DLR includes a first side DLR_S1 that is adjacent to or in contact with the first dummy cell region DCR1, and a second side DLR_S2 that is adjacent to or in contact with the second dummy cell region DCR2. The first dummy cell region DCR1 includes a third side DCR1_S that is adjacent to or in contact with the first side DLR_S1, and the second dummy cell region DCR2 includes a fourth side DCR2_S that is adjacent to or in contact with the second side DLR_S2. When measured in the first direction D1, a length of the first side DLR_S1 is less than that of the third side DCR1_S and a length of the second side DLR_S2 is less than that of the fourth side DCR2_S. In some embodiments, the first, second, third, and fourth sides DLR_S1, DLR_S2, DCR1_S, and DCR2_S are substantially parallel to the first direction D1. In certain embodiments, the dummy connection region DLR may be a rectangular or square region, whose sides are substantially parallel to the first and second directions D1 and D2.

FIGS. 2A, 3, and 4A to 7A are plan views that illustrate a method of fabricating a semiconductor device according to some embodiments of the inventive concept. FIGS. 2B and 4B to 7B are sectional views taken along lines I-I' of FIGS. 2A and 4A to 7A, respectively, FIGS. 2C and 4C to 7C are sectional views taken along lines II-II' of FIGS. 2A and 4A to 7A, respectively, and FIGS. 2D and 4D to 7D are sectional views taken along lines III-III' of FIGS. 2A and 4A to 7A, respectively.

Referring to FIGS. 2A to 2D, according to some embodiments, a substrate 110 is provided. The substrate 110 may be a silicon substrate, a germanium substrate, or a silicon-on-insulator (SOI) substrate.

According to some embodiments, the substrate 110 includes a main region MR and a dummy region DR. The main region MR includes first and second main regions MR1 and MR2 spaced apart from each other in a first direction D1, and the dummy region DR includes first and second dummy cell regions DCR1 and DCR2 spaced apart from each other in a second direction D2 that is orthogonal to the first direction D1, and a dummy connection region DLR connecting the first and second dummy cell regions DCR1 and DCR2 to each other. The main and dummy regions MR and DR have substantially the same features as the main and dummy regions MR and DR described with reference to FIG. 1, and thus a repeated description thereof will be omitted.

According to some embodiments, the substrate 110 is patterned to form first trenches TRC1 that define main active patterns MAP on the main region MR and dummy active patterns DAP on the dummy region DR. Each of the main active patterns MAP extends in the second direction D2 and are formed on the main region MR, but not on the dummy region DR. By contrast, each of the dummy active patterns DAP extends in the second direction D2 and are formed on the dummy region DR, but not on the main region MR. When viewed in a plan view, the main active patterns MAP are spaced apart from the dummy active patterns DAP. In the main region MR, the main active patterns MAP are arranged and spaced apart from each other by a first interval IV1 in the first direction D1. In the dummy region DR, the dummy active patterns DAP are arranged and spaced apart from each other by a second interval IV2 in the first direction D1. In some embodiments, the first interval IV1 may be substantially equal to the second interval IV2. An interval IV3 between the main and dummy active patterns MAP and DAP adjacent to each other in the first direction D1 is greater than the first and second intervals IV1 and IV2. In some embodiments, the formation of the first trenches TRC1 includes performing a photolithography process to form photoresist patterns on the substrate 110 and etching the substrate 110 using the photoresist patterns as an etch mask.

According to some embodiments, the dummy active patterns DAP include first dummy active patterns DAP1 on the first dummy cell region DCR1, second dummy active patterns DAP2 on the second dummy cell region DCR2, and connection dummy active patterns DAP3 on the dummy connection region DLR. The number of the connection dummy active patterns DAP3 may be less than the number of the first dummy active patterns DAP1 and the number of the second dummy active patterns DAP2. Some of the first dummy active patterns DAP1 are connected to some of the second dummy active patterns DAP2 through the connection dummy active patterns DAP3. The connected first dummy active pattern DAP1, connection dummy active pattern DAP3, and second dummy active pattern DAP2 are disposed on a straight line substantially parallel to the second direction D2. For example, the connected first dummy active pattern DAP1, connection dummy active pattern DAP3, and second dummy active pattern DAP2 constitute a single body extending in the second direction D2.

According to some embodiments, a first device isolation layer ST1 is formed to fill a portion of the first trench TRC1. The formation of the first device isolation layer ST1 includes forming an insulating layer, such as a silicon oxide layer, to fill the first trench TRC1, planarizing the insulating layer, and recessing an upper portion of the planarized insulating layer. The recessing of the insulating layer exposes an upper region, hereinafter called an active fin AF, of each of the active patterns MAP and DAP.

Figure 3:
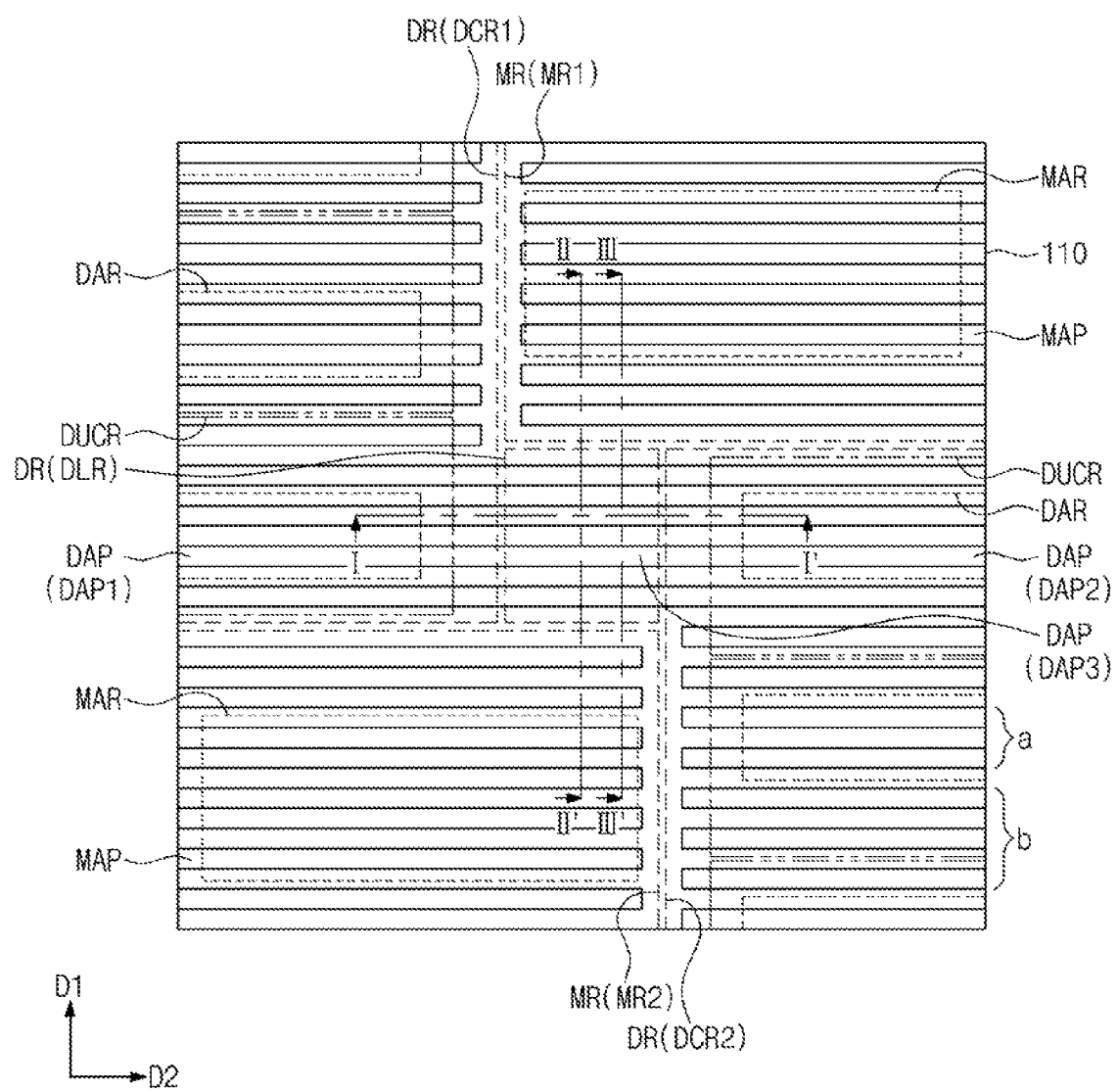
Figure 4A:
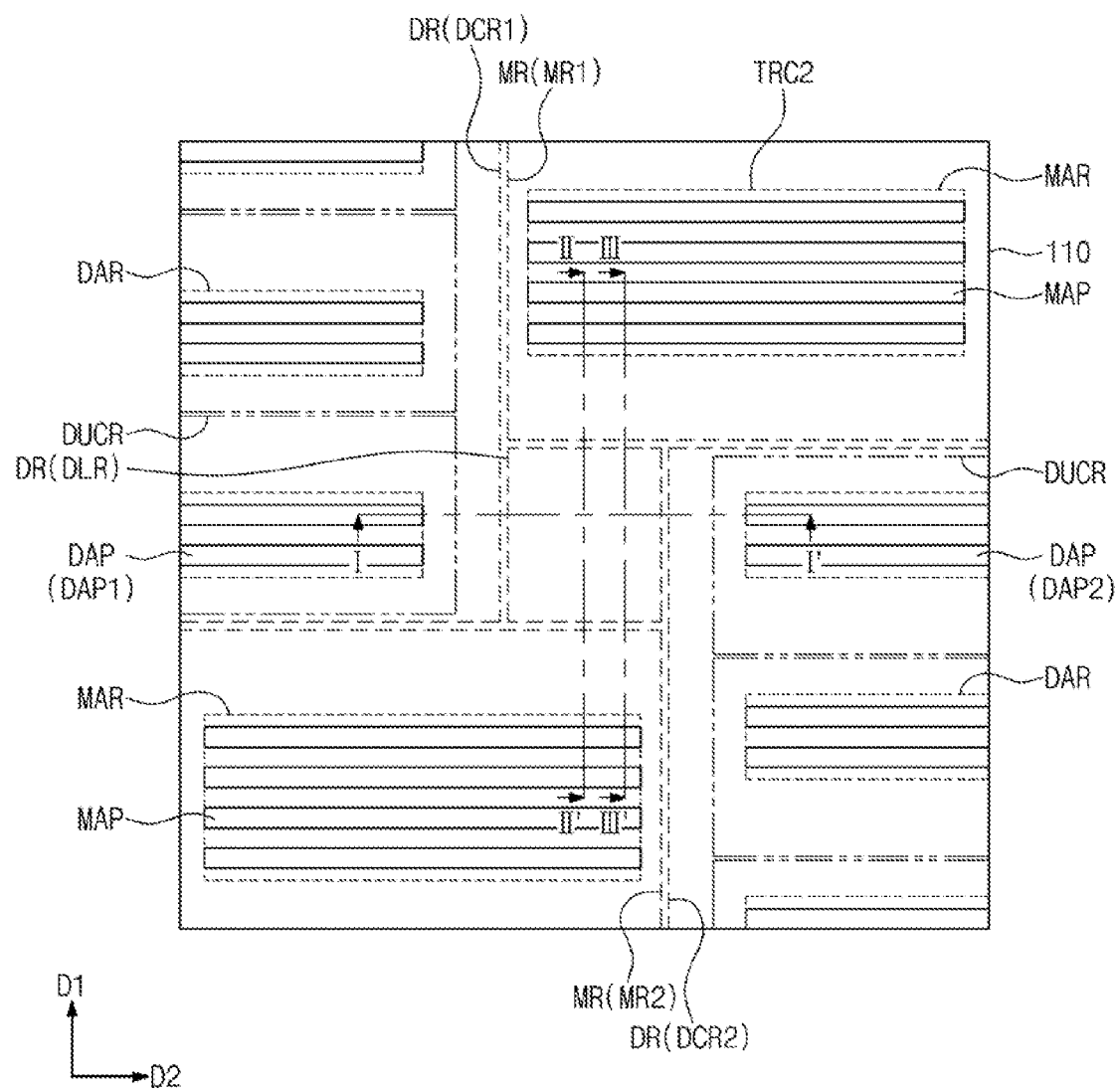
Figure 4B:
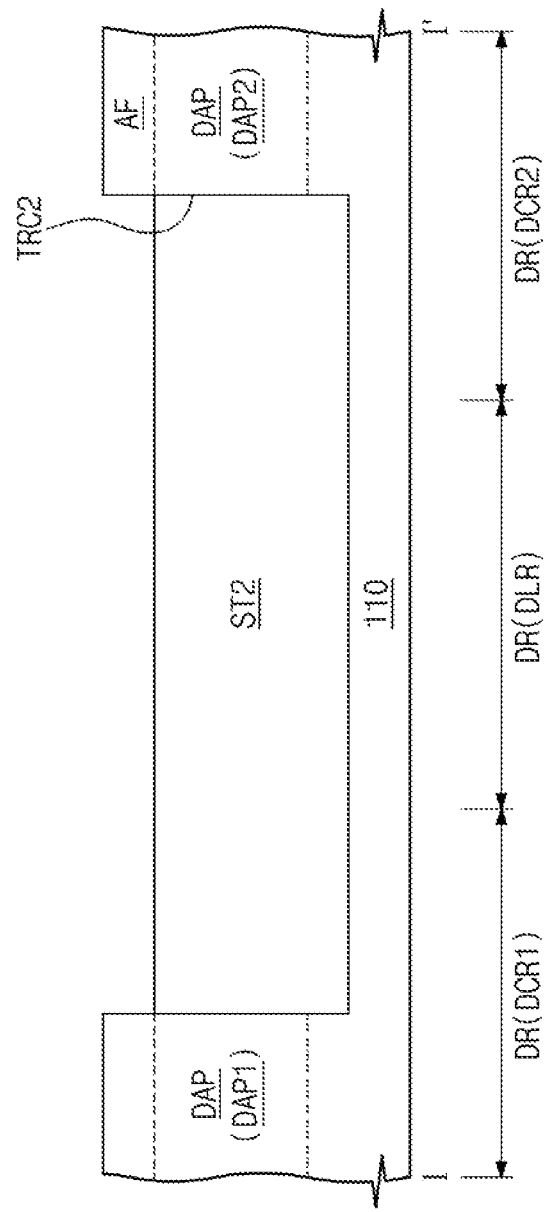
Figure 4D:
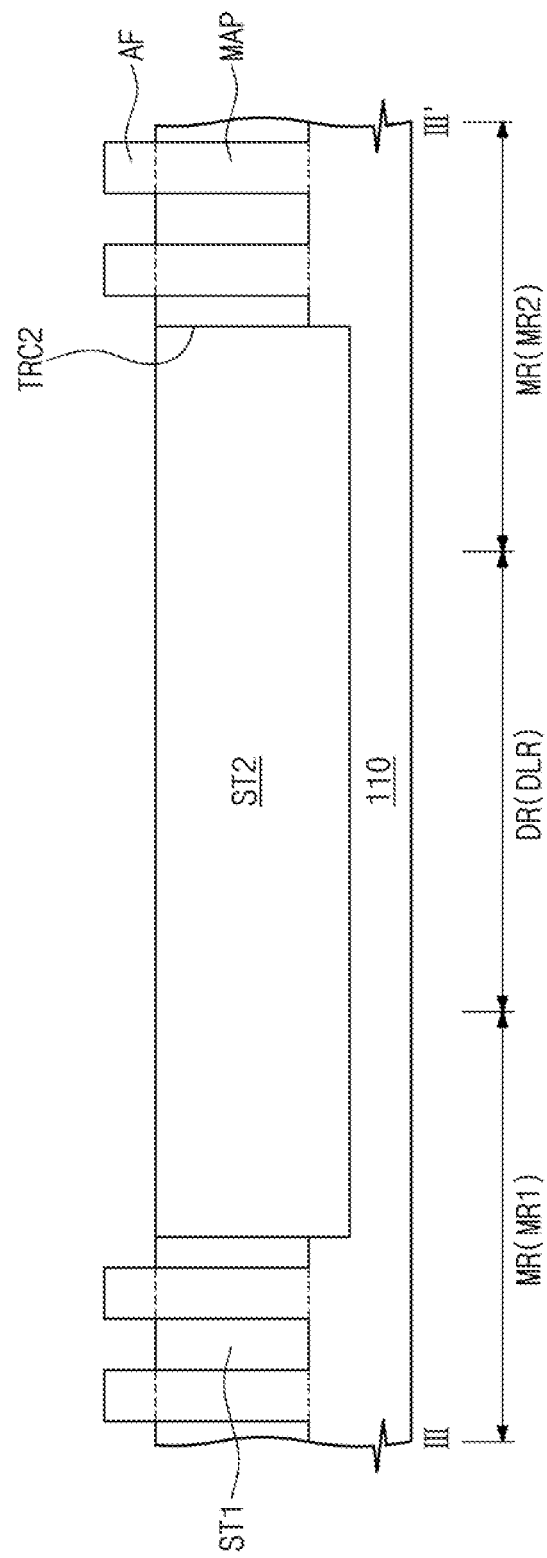

Referring to FIG. 3, according to some embodiments, dummy unit cell regions DUCR are defined in each of the first and second dummy cell regions DCR1 and DCR2. Each dummy unit cell region DUCR corresponds to a region on which the dummy unit cell described with reference to FIG. 1 will be formed. In each of the first and second dummy cell regions DCR1 and DCR2, the dummy unit cell regions DUCR can be arranged in the first direction D1 and/or the second direction D2, and in certain embodiments, an interval therebetween in the first direction D1 is substantially zero. Each of the dummy unit cell regions DUCR has a rectangular or square shape whose sides are substantially parallel to the first and second direction D1 and D2. For example, in the first and second dummy cell regions DCR1 and DCR2, the dummy unit cell regions DUCR can be arranged in a grid or checkerboard pattern.

According to some embodiments, when measured in the first direction D1, a width of each of the dummy unit cell regions DUCR is greater than a width of the dummy connection region DLR. Accordingly, the number of the dummy active patterns DAP in each of the dummy unit cell regions DUCR is greater than the number of the dummy active patterns DAP, i.e., the connection dummy active patterns DAP3, in the dummy connection region DLR. In certain embodiments, the dummy unit cell regions DUCR are not defined in the dummy connection region DLR because the width in the first direction D1 of each of the dummy unit cell regions DUCR may be greater than that of the dummy connection region DLR.

According to some embodiments, each of the dummy unit cell regions DUCR includes a dummy active region DAR. The dummy active region DAR is not recessed in a subsequent recess process that forms a second trench TRC2, which will be described with reference to FIGS. 4A to 4D, and thus, the dummy active patterns DAP remain on the dummy active region DAR after the recess process. In some embodiments, each of the dummy unit cell regions DUCR includes one dummy active region DAR as shown in FIG. 3. But embodiments of the inventive concept are not limited thereto, and in certain embodiments, each of the dummy unit cell regions DUCR includes a plurality of dummy active regions DAR spaced apart from each other in the first direction D1. In some embodiments, the dummy active regions DAR have a rectangular or square shape whose sides are substantially parallel to the first and second directions D1 and D2, as shown in FIG. 3. The number and shape of the dummy active regions DAR are the same in each of the dummy unit cell regions DUCR. Accordingly, in each of the first and second dummy cell regions DCR1 and DCR2, the dummy active regions DAR are spaced apart from each other by a same interval.

If, according to an embodiment, as shown in FIG. 3, one dummy active region DAR is included in each dummy unit cell region DUCR, the dummy active patterns DAP is disposed so that the sum of the numbers 'a' and 'b' is greater than the number of the dummy active patterns DAP, i.e., the connection dummy active patterns DAP3, in the dummy connection region DLR. Here, the number 'a' is the number of dummy active patterns DAP in each dummy active region DAR and the number 'b' is the number of dummy active patterns DAP between an adjacent pair of dummy active regions DAR. For example, the dummy active patterns DAP may be disposed in such a way that the sum a+b is equal to the number of the dummy active patterns DAP in each of the dummy unit cell regions DUCR.

By contrast, if a plurality of the dummy active regions DAR are included in each of the dummy unit cell regions DUCR, the dummy active patterns DAP can be disposed so that the value of (a+b)×n is greater than the number of the dummy active patterns DAP, i.e., the connection dummy active patterns DAP3 in the dummy connection region DLR. Here, 'n' is the number of dummy active regions DAR included in each dummy unit cell region DUCR. For example, the dummy active patterns DAP can be disposed so that the value (a+b)×n is equal to the number of dummy active patterns DAP in each of the dummy unit cell regions DUCR.

According to some embodiments, main active regions MAR are defined in the main region MR. The main active regions MAR are be recessed in a subsequent recess process that forms the second trench TRC2, which will be described with reference to FIGS. 4A to 4D, and thus, the main active patterns MAP remain on the main active regions MAR after the recess process. In some embodiments, each of the main active regions MAR has a rectangular or square shape whose sides are substantially parallel to the first and second direction D1 and D2, as shown in FIG. 3. But embodiments of the inventive concept are be limited thereto. For example, the shape of the main active region MAR may vary. In addition, at least one of the main active regions MAR may have a shape different from a shape of the others.

As described above, the dummy region DR is used to achieve a uniform process condition throughout the entire region of the substrate 110, when performing steps for forming the semiconductor elements. The dummy active patterns DAP also help maintain uniform process conditions throughout the entire region of the substrate 110. For example, the dummy active patterns DAP help to uniformly maintain optical and etching characteristics throughout the entire region of the substrate 110 when forming the first trench TRC1 and thus help uniformly form the main active patterns MAP. In addition, when forming the first device isolation layer ST1, the dummy active patterns DAP help uniformly plagiarize the entire region of the substrate 110.

According to some embodiments of the inventive concept, the dummy active patterns DAP are formed on not only the first and second dummy cell regions DCR1 and DCR2, which include the dummy unit cell regions DUCR, but also the dummy connection region DLR, which lack the dummy unit cell regions DUCR. This helps to more uniformly form the main active patterns MAP and to improve process uniformity in a planarization process.

Referring to FIGS. 4A to 4D, according to some embodiments, a second trench TRC2 is formed. The second trench TRC2 is formed by recessing other regions, except for the main and dummy active regions MAR and DAR. In other words, the main and dummy active regions MAR and DAR are defined by the second trenches TRC2. In some embodiments, a depth of the second trench TRC2 is substantially equal to or greater than that of the first trench TRC1. Accordingly, portions of the main and dummy active patterns MAP and DAP, which respectively overlap with the main and dummy active regions MAR and DAR in a plan view, remain, and the other portions are removed. For example, the connection dummy active patterns DAP3, which do not overlap with the main active regions MAR or the dummy active regions DAR in a plan view, are removed by the process that forms the second trench TRC2. In addition, the main active patterns MAP between the main active regions MAR and the dummy active patterns DAP between the dummy active regions DAR are removed by the process that forms the second trench TRC2.

According to some embodiments, a second device isolation layer ST2 is formed to fill a portion of the second trench TRC2. The formation of the second device isolation layer ST2 includes forming an insulating layer, such as a silicon oxide layer, to fill the second trench TRC2, planarizing the insulating layer, and recessing an upper portion of the planarized insulating layer. The recessing of the insulating layer exposes an upper portion, i.e., the active fin AF, of each of the active patterns MAP and DAP.

Figure 5A:
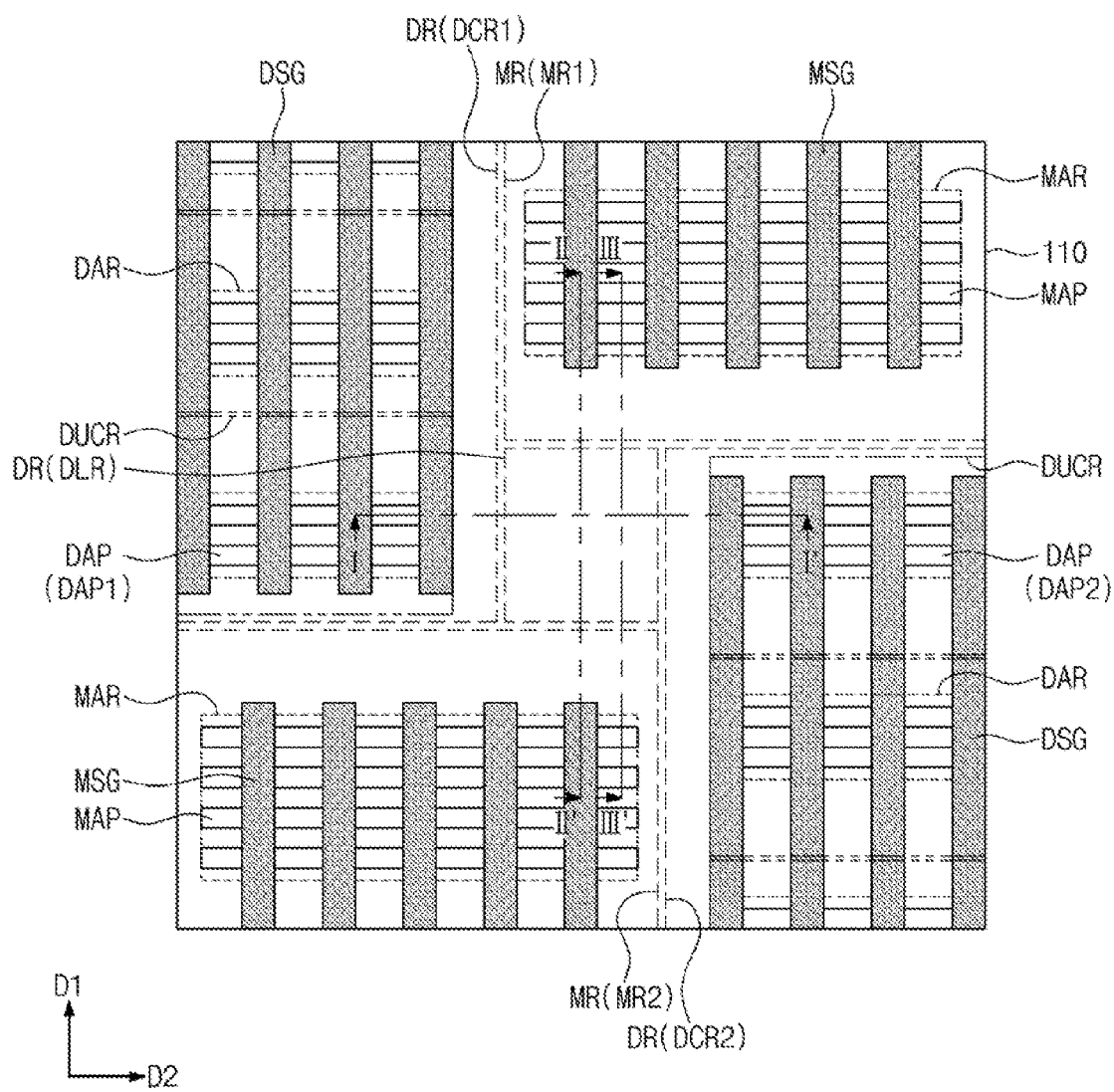
Figure 5B:
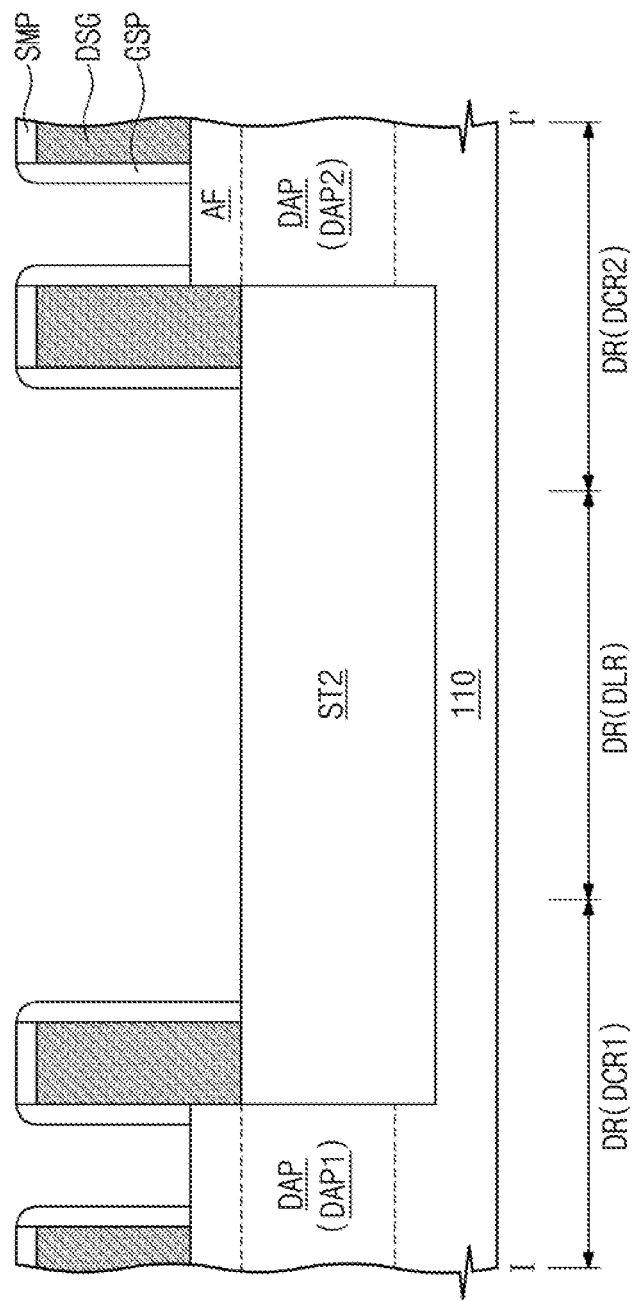
Figure 5C:
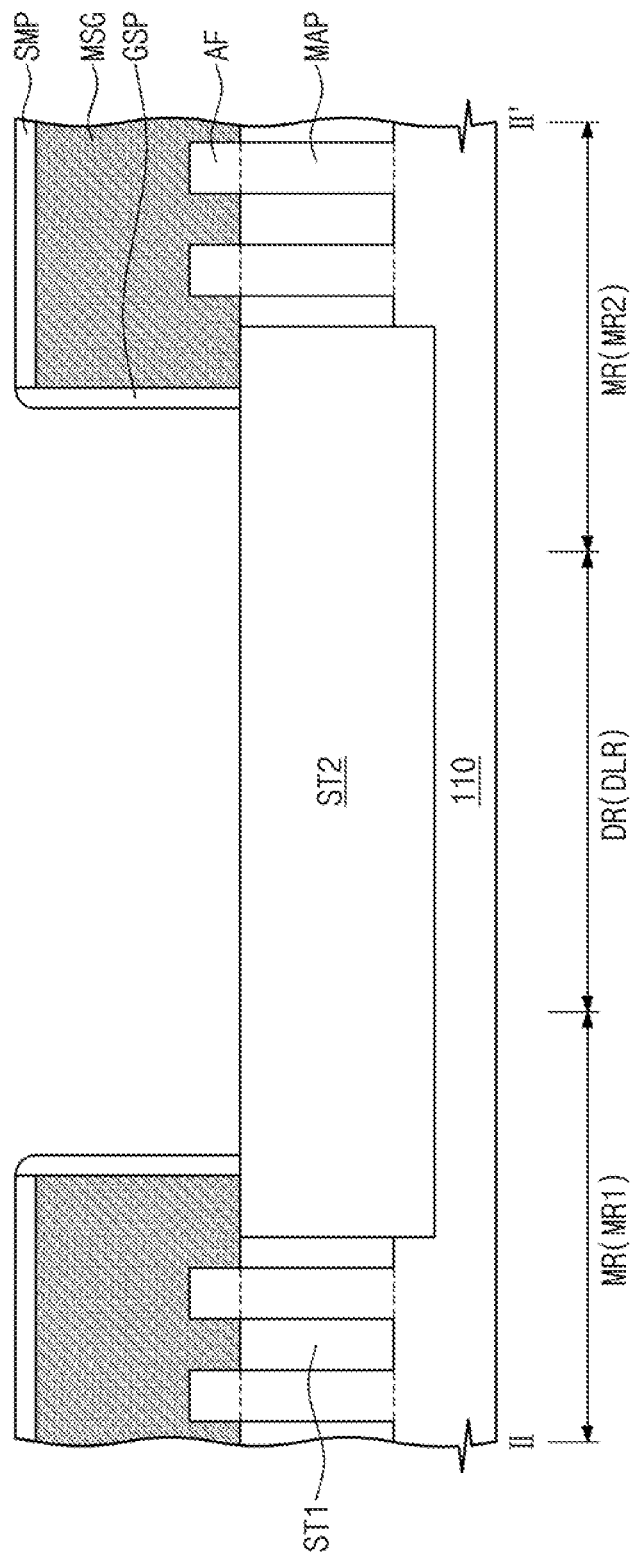
Figure 5D:
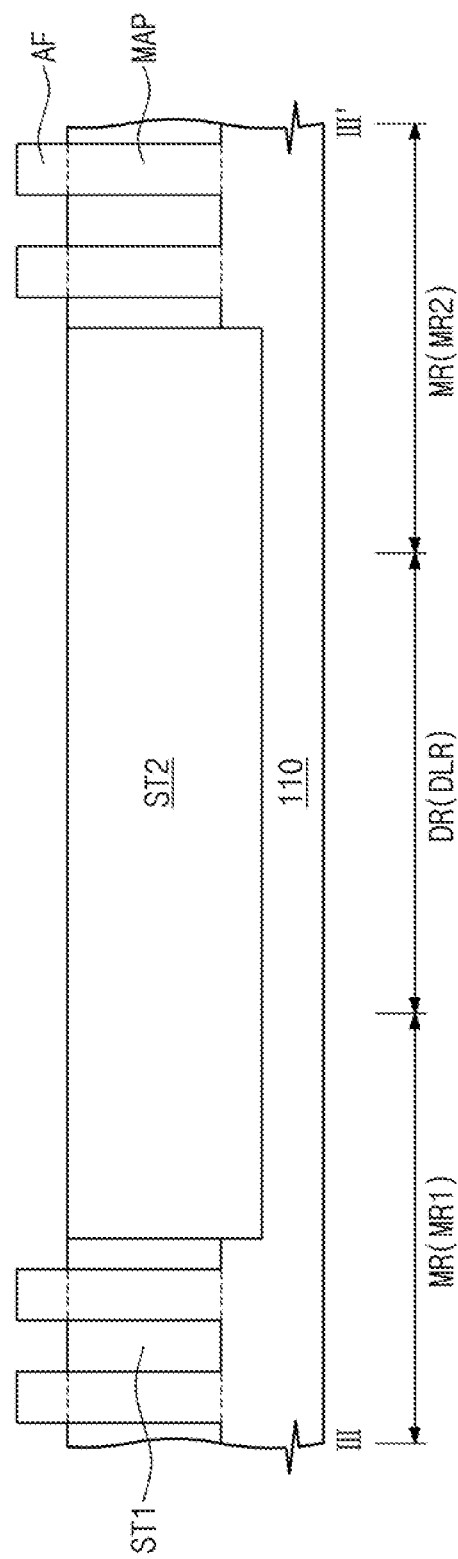
Figure 6A:
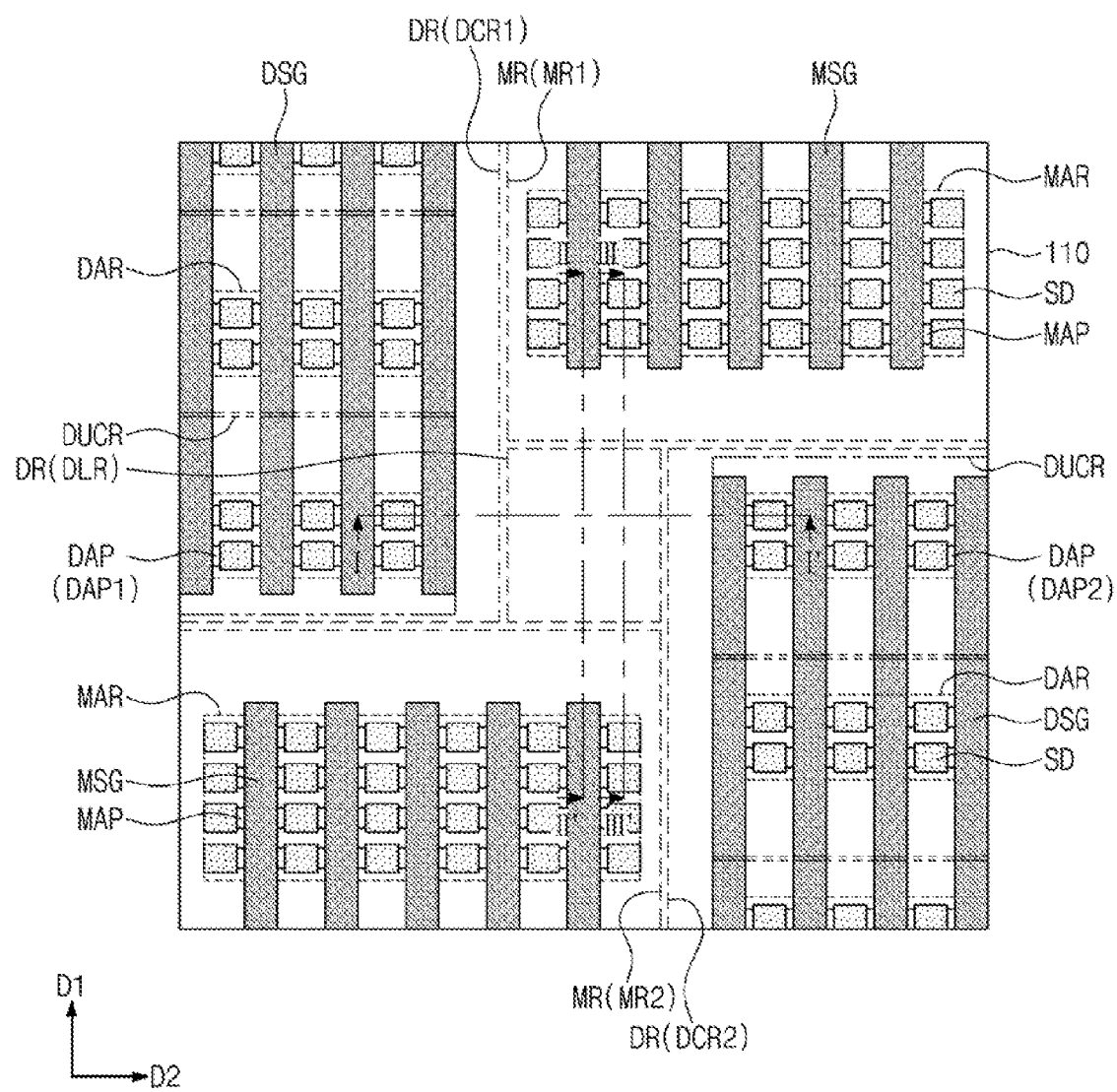
Figure 6B:
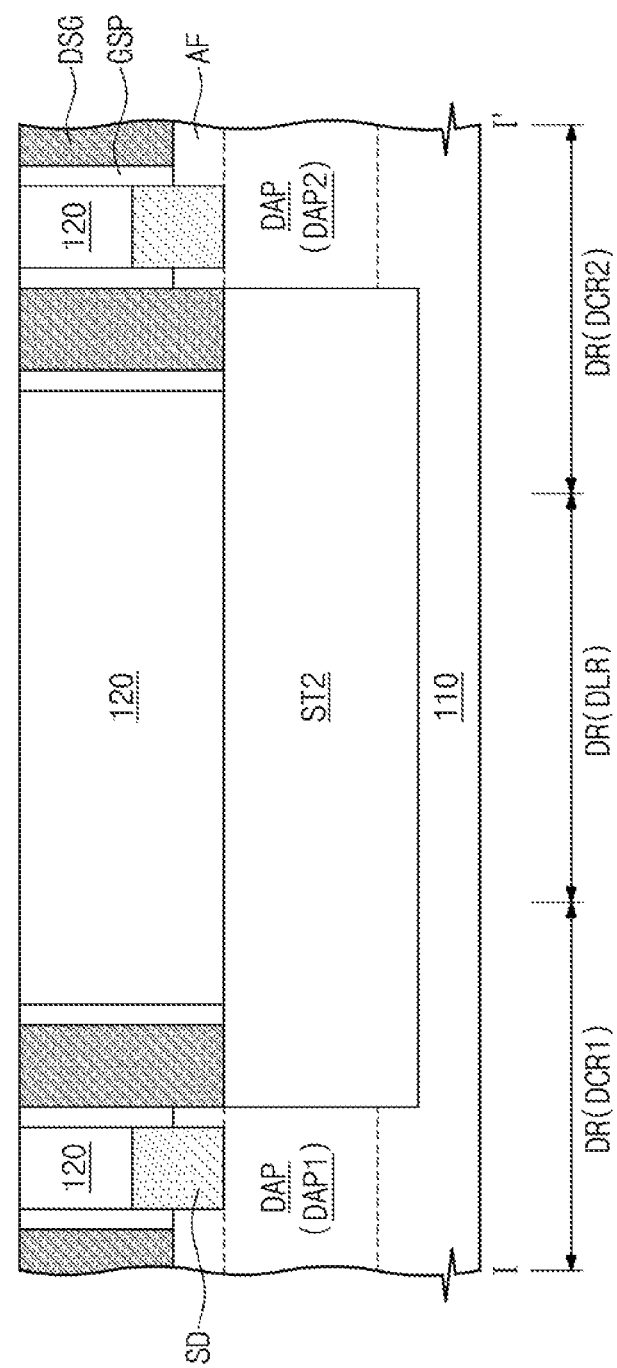
Figure 6C:
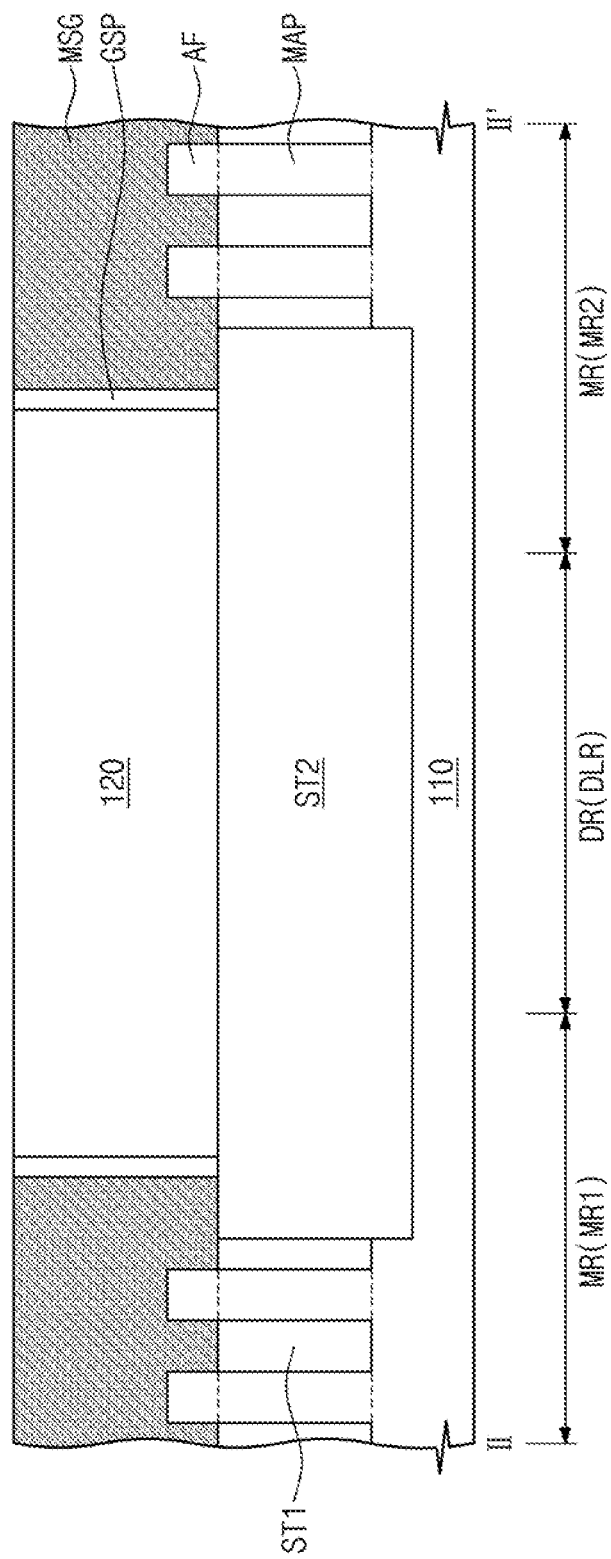
Figure 7A:
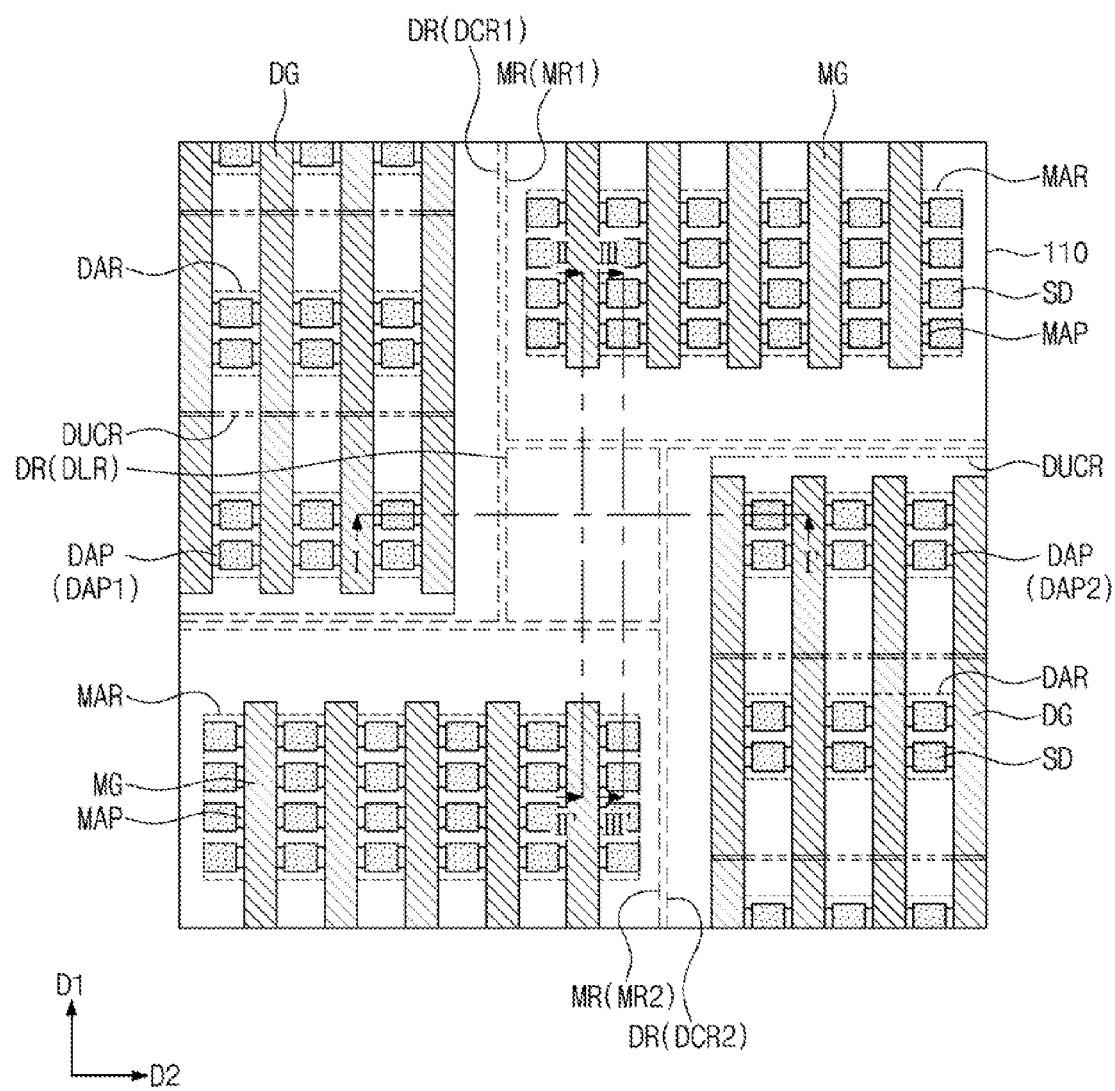
Figure 7B:
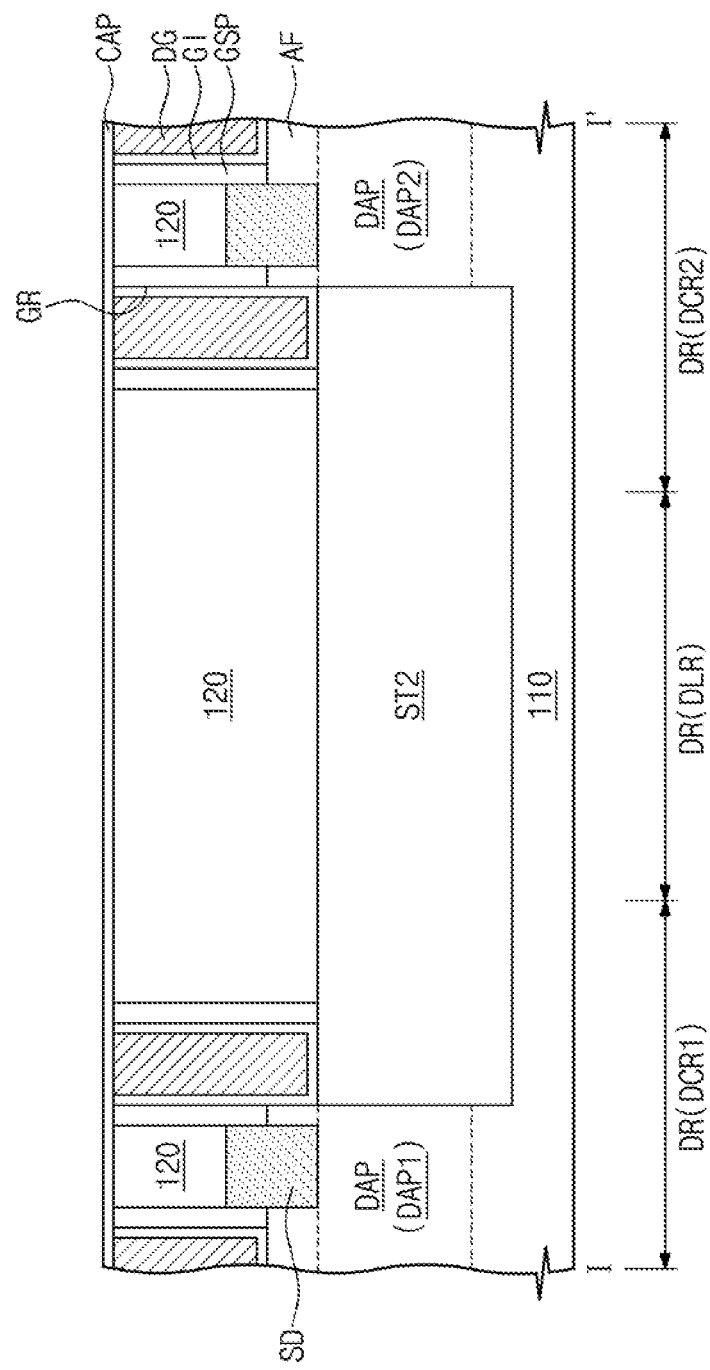
Figure 7C:
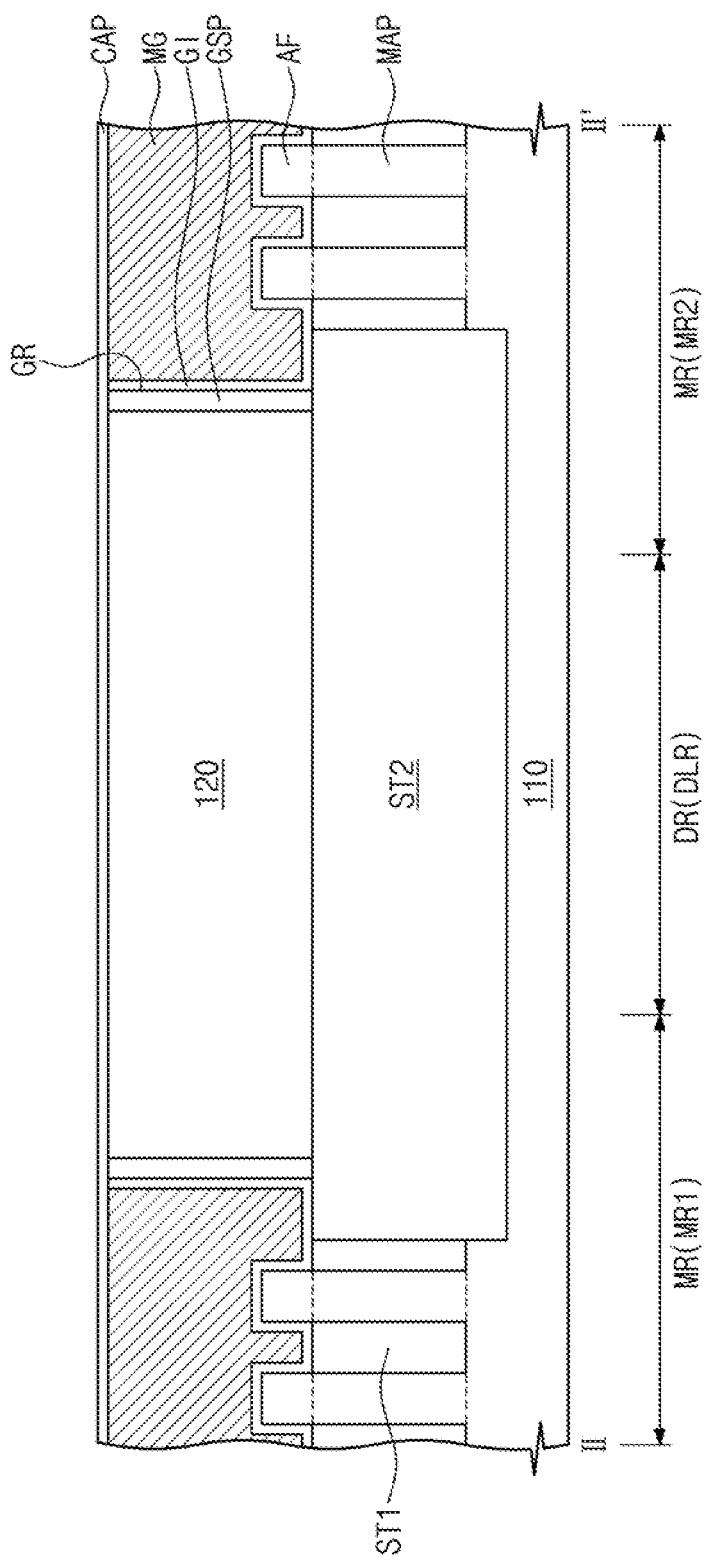
Figure 7D:
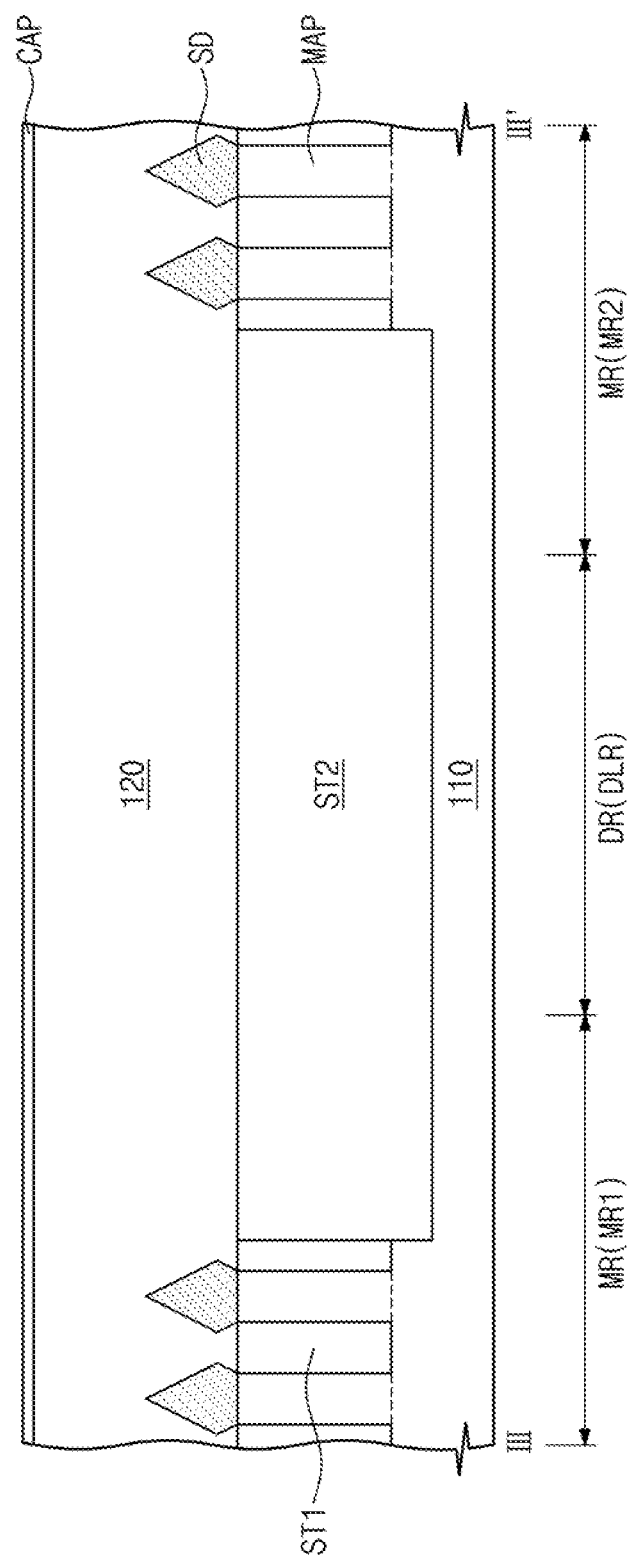

Referring to FIGS. 5A to 5D, according to some embodiments, main sacrificial gates MSG and dummy sacrificial gates DSG are formed. The main sacrificial gates MSG are formed on the first and second main regions MR1 and MR2 and extend in the first direction D1 to cross the main active patterns MAP. The main sacrificial gates MSG are spaced apart from each other in the second direction D2. The main sacrificial gates MSG are spaced apart from the first and second dummy cell regions DCR1 and DCR2. In some embodiments, as shown in FIG. 5A, the main sacrificial gates MSG are spaced apart from the dummy connection region DLR. However, embodiments of the inventive concept are not limited thereto; and, for example, the main sacrificial gates MSG may include portions located on the dummy connection region DLR. The dummy sacrificial gates DSG are formed on the first and second dummy cell regions DCR1 and DCR2 and extend in the first direction D1 to cross the dummy active patterns DAP. The dummy sacrificial gates DSG are spaced apart from each other in the second direction D2. The dummy sacrificial gates DSG are spaced apart from the main region MR. The formation of the main and dummy sacrificial gates MSG and DSG includes sequentially forming an etch stop layer and a sacrificial gate layer on the substrate 110 to cover the main and dummy active patterns MAP and DAP, forming sacrificial mask patterns SMP on the sacrificial gate layer, and patterning the sacrificial gate layer and the etch stop layer using the sacrificial mask patterns SMP as an etch mask. Accordingly, an etch stop pattern is formed below each of the sacrificial gates MSG and DSG. The main sacrificial gates MSG and the dummy sacrificial gates DSG are formed of or include poly silicon.

According to some embodiments, gate spacers GSP are formed on both sidewalls of each of the sacrificial gates MSG and DSG. The formation of the gate spacers GSP includes forming a spacer layer to cover the sacrificial gates MSG and DSG and anisotropically etching the spacer layer. The gate spacers GSP are formed of or include at least one of silicon oxide, silicon nitride, or silicon oxynitride.

Referring to FIGS. 6A to 6D, according to some embodiments, source/drain regions SD are formed on the active patterns MAP and DAP located at both sides of each of the sacrificial gates MSG and DSG. In some embodiments, the formation of the source/drain regions SD includes removing portions of the upper portions, such as the active fins AF, of the active patterns MAP and DAP, and then, performing a selective epitaxial growth process in which the active patterns MAP and DAP are used as a seed layer. If the active regions MAR and DAR are used to form pMOSFETs, the source/drain regions SD are formed of a compressive-strain-inducing material such as silicon germanium (SiGe). By contrast, if the active region MAR and DAR are used to form nMOSFETs, the source/drain regions SD are formed of a tensile-strain-inducing material such as silicon carbide (SiC). In certain embodiments, unlike that shown in FIGS. 6A to 6D, formation of the source/drain regions SD includes performing an ion implantation process to dope portions of the active fins AF with impurities.

According to embodiments, the source/drain regions SD are not formed on portions of the active patterns MAP and DAP that are below and overlap the sacrificial gates MSG and DSG, such as other portions of the active fins AF.

According to some embodiments, an interlayer insulating layer 120 is formed on the substrate 110 to cover the sacrificial gates MSG and DSG. The interlayer insulating layer 120 is formed of or includes at least one of silicon oxide, silicon nitride, or silicon oxynitride. The interlayer insulating layer 120 is planarized to expose the top surfaces of the sacrificial gates MSG and DSG.

Referring to FIGS. 7A to 7D, according to some embodiments, the sacrificial gates MSG and DSG are removed to form gap regions GR between the gate spacers GSP. The formation of the gap region GR includes performing a first etching process to remove the sacrificial gates MSG and DSG, and performing a second etching process to remove the etch stop pattern. The first etching process is performed using an etch recipe having an etch selectivity with respect to the interlayer insulating layer 120, the gate spacers GSP, and the etch stop pattern, and the second etching process is performed using an etch recipe having an etch selectivity with respect to the interlayer insulating layer 120, the gate spacers GSP, and the substrate 110.

According to some embodiments, a gate insulating layer is formed to conformally cover the gap regions GR, and then, a gate electrode layer is formed to fill the gap region GR in the gate insulating layer. The gate insulating layer may be formed of or includes at least one of silicon oxide, silicon oxynitride, or high-k dielectric materials having dielectric constants higher than that of silicon oxide. The gate electrode layer is formed of or includes at least one of doped semiconductor materials, metals, or conductive metal nitrides. Thereafter, the gate insulating layer and the gate electrode layer are planarized to expose the top surface of the interlayer insulating layer 120 and to form gate insulating patterns GI and main and dummy gate electrodes MG and DG. The main gate electrodes MG are formed in the gap regions GR, respectively, by removing the main sacrificial gates MSG, and the dummy gate electrodes DG are formed in the gap regions GR, respectively, by removing the dummy sacrificial gates DSG.

According to some embodiments, a capping layer CAP is formed to cover top surfaces of the gate electrodes MG and DG. The capping layer CAP is formed of or includes at least one of silicon oxide or silicon oxynitride.

Thereafter, according to some embodiments, gate contacts and source/drain contacts are formed. The gate contacts are electrically connected to the gate electrodes MG and DG, and the source/drain contacts are electrically connected to the source/drain regions SD. Some of the gate contacts may be connected to the dummy gate electrodes DG, but they may be disconnected from other conductive elements, other than the dummy gate electrodes DG. Similarly, some of the source/drain contacts may be connected to the source/drain regions SD on the dummy region DR, but they are disconnected from other conductive elements, except for the source/drain regions SD. Accordingly, the dummy gate electrodes DG and the source/drain regions SD on the dummy region DR are electrically floated.

According to some embodiments of the inventive concept, dummy active patterns can be formed on not only first and second dummy cell regions, in which dummy unit cell regions are provided, but also a dummy connection region, in which dummy unit cell regions are not provided. This can make it possible to more uniformly form the main active patterns and to improve process uniformity in a planarization process.

While exemplary embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor device, comprising:
providing a substrate that includes first and second main regions spaced apart from each other in a first direction, and a dummy region that comprises a dummy connection region between the first and second main regions and first and second dummy cell regions spaced apart from each other in a second direction orthogonal to the first direction with the dummy connection region interposed therebetween;

forming dummy active patterns that extend in the second direction and are spaced apart from each other in the first direction on the dummy region, wherein the dummy active patterns comprise first dummy active patterns on the first dummy cell region, second dummy active patterns on the second dummy cell region, and connection dummy active patterns on the dummy connection region, wherein the connection dummy active patterns connect some of the first dummy active patterns to some of the second dummy active patterns; and forming dummy gate electrodes that extend in the first direction on the first and second dummy cell regions, wherein the number of the connection dummy active patterns is less than the number of the first dummy active patterns and the number of the second dummy active patterns.

2. The method of claim 1, further comprising forming main active patterns that extend in the second direction and are spaced apart from each other in the first direction on the first and second main regions, before forming the dummy gate electrodes.

3. The method of claim 2, wherein forming the dummy and main active patterns comprises patterning the substrate to form a trench that defines the dummy and main active patterns.

4. The method of claim 2, wherein the dummy active patterns are spaced apart from each other by a first interval in the first direction, and
the main active patterns are spaced apart from each other by a second interval in the first direction,
wherein the first interval is substantially equal to the second interval.

5. The method of claim 4, wherein an interval between an adjacent pair of the dummy and main active patterns is greater than each of the first and second intervals.

6. The method of claim 2, wherein the dummy active patterns are spaced apart from the main active patterns in a plan view.

7. The method of claim 1, wherein the first dummy active pattern, the connection dummy active pattern, and the second dummy active pattern, which are connected to each other, are disposed in a straight line parallel to the second direction.

8. The method of claim 7, wherein the first dummy active pattern, the connection dummy active pattern, and the second dummy active pattern, which are connected to each other, form a single body that extends in the second direction.

9. The method of claim 1, further comprising forming a trench in each of the first and second dummy cell regions, before forming the dummy gate electrodes,
wherein the trench defines dummy active regions, which are arranged in the first direction and are spaced apart from each other in the first direction.

10. The method of claim 9, wherein forming the trench comprises removing the connection dummy active patterns.

11. The method of claim 9, wherein forming the trench comprises removing the dummy active patterns from a region between an adjacent pair of the dummy active regions.

12. The method of claim 11, wherein the number of the connection dummy active patterns is less than a sum of the number of the dummy active patterns in each of the dummy active regions and the number of the dummy active patterns removed from the region between the adjacent pair of the dummy active regions.

13. The method of claim 1, wherein the dummy connection region comprises first and second sides parallel to the first direction,
the first dummy cell region comprises a third side that is parallel to the first direction and in contact with the first side, and
the second dummy cell region comprises a fourth side that is parallel to the first direction and in contact with the second side,
wherein a length of the third side is greater than that of the first side, and a length of the fourth side is greater than that of the second side.

14. The method of claim 1, further comprising forming main gate electrodes that extend in the first direction on the first and second main regions,
wherein at least one of the main gate electrodes extends to include a portion disposed on the dummy connection region.

15. The method of claim 1, wherein the dummy gate electrodes are electrically floated.

16. A method of fabricating a semiconductor device, comprising:
providing a substrate that includes first and second main regions spaced apart from each other in a first direction, and a dummy region that comprises a dummy connection region between the first and second main regions and first and second dummy cell regions spaced apart from each other in a second direction orthogonal to the first direction with the dummy connection region interposed therebetween;
forming dummy active patterns that extend in the second direction and are spaced apart from each other in the first direction on the dummy region, wherein the dummy active patterns comprise first dummy active patterns on the first dummy cell region, second dummy active patterns on the second dummy cell region, and connection dummy active patterns on the dummy connection region, wherein the connection dummy active patterns connect some of the first dummy active patterns to some of the second dummy active patterns; and
forming a trench in each of the first and second dummy cell regions, the trench defining dummy active regions which are arranged in the first direction and are spaced apart from each other in the first direction,
wherein forming the trench comprises removing the dummy active patterns from a region between an adjacent pair of the dummy active regions, and
wherein the number of connection dummy active patterns is less than a sum of the number of the dummy active patterns in each of the dummy active regions and the number of dummy active patterns removed from the region between the adjacent pair of dummy active regions.

17. The method of claim 16, further comprising:
forming main gate electrodes that extend in the first direction on the first and second main regions; and
forming dummy gate electrodes that extend in the first direction on the first and second dummy cell regions, wherein the dummy gate electrodes are electrically floated;
wherein at least one of the main gate electrodes extends to include a portion located on the dummy connection region, and
wherein the number of connection dummy active patterns is less than the number of first dummy active patterns and the number of second dummy active patterns.

18. The method of claim 16, further comprising forming main active patterns that extend in the second direction and are spaced apart from each other in the first direction on the first and second main regions, wherein the dummy active patterns are spaced apart from each other by a first interval in the first direction, the main active patterns are spaced apart from each other by a second interval in the first direction, and the first interval is substantially equal to the second interval, and wherein an interval between an adjacent pair of dummy and main active patterns is greater than either of the first and second intervals.

19. The method of claim 16, wherein the first dummy active pattern, the connection dummy active pattern, and the second dummy active pattern, which are connected to each other, are disposed in a straight line parallel to the second direction, and the first dummy active pattern, the connection dummy active pattern, and the second dummy active pattern, which are connected to each other, form a single body extending in the second direction.

20. The method of claim 16, wherein the dummy connection region comprises first and second sides parallel to the first direction, the first dummy cell region comprises a third side that is parallel to the first direction and in contact with the first side, and the second dummy cell region comprises a fourth side that is parallel to the first direction and in contact with the second side, wherein a length of the third side is greater than that of the first side, and a length of the fourth side is greater than that of the second side.

* * * * *